United States Patent [19]
Peckman

[11] Patent Number: 5,992,429
[45] Date of Patent: *Nov. 30, 1999

[54] METHOD FOR CLEANING SEMICONDUCTOR WAFERS WITH AN EXTERNAL HEAT SOURCE

[75] Inventor: Robert Peckman, Roanoke, Va.

[73] Assignee: ITT Manufacturing Enterprises, Wilmington, Del.

[*] Notice: This patent issued on a continued prosecution application filed under 37 CFR 1.53(d), and is subject to the twenty year patent term provisions of 35 U.S.C. 154(a)(2).

[21] Appl. No.: 08/815,959
[22] Filed: Mar. 13, 1997
[51] Int. Cl.$^6$ ........................................... B08B 7/00
[52] U.S. Cl. .................. 134/1.3; 134/1; 134/902
[58] Field of Search ................... 134/1.3, 1, 1.2, 134/902

[56] References Cited

U.S. PATENT DOCUMENTS

| | | | |
|---|---|---|---|
| 4,871,417 | 10/1989 | Nishizawa et al. | 134/1 X |
| 4,877,757 | 10/1989 | York et al. | 437/235 |
| 5,470,266 | 11/1995 | Stanley et al. | 445/59 |

*Primary Examiner*—Jill Warden
*Assistant Examiner*—Alexander Markoff
*Attorney, Agent, or Firm*—Arthur L. Plevy

[57] ABSTRACT

A method of cleaning semiconductor wafers by use of a heat source external to the system is disclosed. The semiconductor wafers are disposed within a vacuum chamber having a transmissive window, and a radiant heat source external to the chamber is applied so that the radiation passes through the window onto the semiconductor wafers. The invention has particular application to semiconductor wafers used for photocathodes and image intensifier tubes.

7 Claims, 1 Drawing Sheet

METHOD FOR CLEANING SEMICONDUCTOR WAFERS WITH AN EXTERNAL HEAT SOURCE

FIELD OF THE INVENTION

The present invention relates to a method for cleaning semiconductor wafers by use of a heat source external to the system. The invention has particular application to semiconductor wafers used for photocathodes and image intensifier tubes, particularly semiconductor wafers fabricated with III–V compounds, such as galium aluminum arsenide or galium arsenide.

BACKGROUND OF THE INVENTION

During the fabrication of semiconductor wafers, undesirable oxide layers or other contaminants, i.e., hydrogen, carbides and other organics, may form on the semiconductor wafer surface. These contaminants adversely affect the reliability and performance of the wafers. The importance of cleaning semiconductors to ensure their basic efficacy is further discussed, for example, in U.S. Pat. No. 5,470,266, issued on Nov. 28, 1995 to Donald H. Stanley, Robert Peckman, and Weston K. Peregoy, Jr., entitled LOW TEMPERATURE PROCESS AND APPARATUS FOR CLEANING PHOTO-CATHODES. The Stanley U.S. Pat. No. 5,470,266 was assigned to ITT Corporation, a related company to the assignee herein, and is hereby incorporated by reference.

A wide variety of methods for cleaning semiconductor wafers have been developed. In the past, many of these methods have involved heating the semiconductor wafers within the reaction tube or vacuum chamber in which the wafers are fabricated. Increasing the temperature serves to break the bonds of the oxides and release the contaminants from the surface of the wafer. Commonly, however, cleaning of semiconductor wafers with the application of heat has been accomplished by placing the wafers on a heat source, such as a heater block, or next to a radiative source, such as a lamp, located inside the vacuum chamber in which the semiconductor wafers are fabricated. Shortcomings exist with regard to such methods. One shortcoming is that excess heat can be created within the vacuum chamber or reaction tube, which is undesirable as semiconductor materials are often strongly temperature dependent.

Another shortcoming of using an internal heat source is that, it is necessary to handle the wafers to position them onto the heater block or next to the lamp before cleaning. The step of handling the semiconductor wafer is disadvantageous in that it is time-consuming and poses a risk of handling damage.

A still further shortcoming with regard to the above cleaning methods is that they typically are not addressed to methods for cleaning a plurality of semiconductor wafers or photocathodes. Instead, the cleaning methods have been addressed to cleaning one semiconductor or photocathode at a time. Up until recently, there essentially has been no need to develop a bulk cleaning method, because the technology has been to activate and fabricate photocathodes individually, that is, one at a time. However, it recently has been discovered that a plurality of photocathodes can be simultaneously fabricated, thus reducing the time and increasing the efficiency of the production process. Such a method is disclosed, for example, in co-pending U.S. patent application Ser. No. 08/801,567, filed Feb. 18, 1997, entitled PROCESS OF ACTIVATING A PLURALITY OF PHOTOCATHODES, involving inventors Donald Stanley, Robert Peckman, Roger M. Voss, and Joseph H. Reich; this application also is assigned to ITT Manufacturing Enterprises, Inc., the assignee of this application, and is hereby incorporated by reference. Accordingly, there now is a need for a method of simultaneously cleaning a plurality of photocathodes or semiconductors.

Therefore, it is an object of the present invention to provide a method of cleaning semiconductor wafers that avoids heating the wafers with a heat source located inside the reaction chamber; that avoids the need to handle the wafers during the fabrication and/or cleaning process; and that can be used to simultaneously clean a plurality of semiconductor wafers. It is a further object of the present invention to provide a cleaning method that is simplified as compared with previous cleaning methods. Further objects, features, and advantages of the present invention will become more apparent to those skilled in the art as the nature of the invention is better understood from the accompanying drawings and detailed description.

SUMMARY OF THE INVENTION

Summarily described, the invention embraces a method of cleaning semiconductor wafers by providing a vacuum chamber having a transmissive window; disposing one or a plurality of semiconductor wafers, such as photocathodes, within the vacuum chamber; and applying a radiant heat source external to the chamber so that the radiation passes through the window onto the semiconductor wafers. Also, use of a reflector to direct the radiation into the vacuum chamber is preferred, as is use of a Tungsten-halogen lamp.

BRIEF DESCRIPTION OF THE DRAWINGS

There is shown in the accompanying drawings an illustration of the invention as presently preferred, with it being understood that this invention is not limited to the precise system shown. To illustrate the invention, a preferred embodiment is described below, considered together with the accompanying drawings, in which.

DETAILED DESCRIPTION OF THE INVENTION

Figure 1:
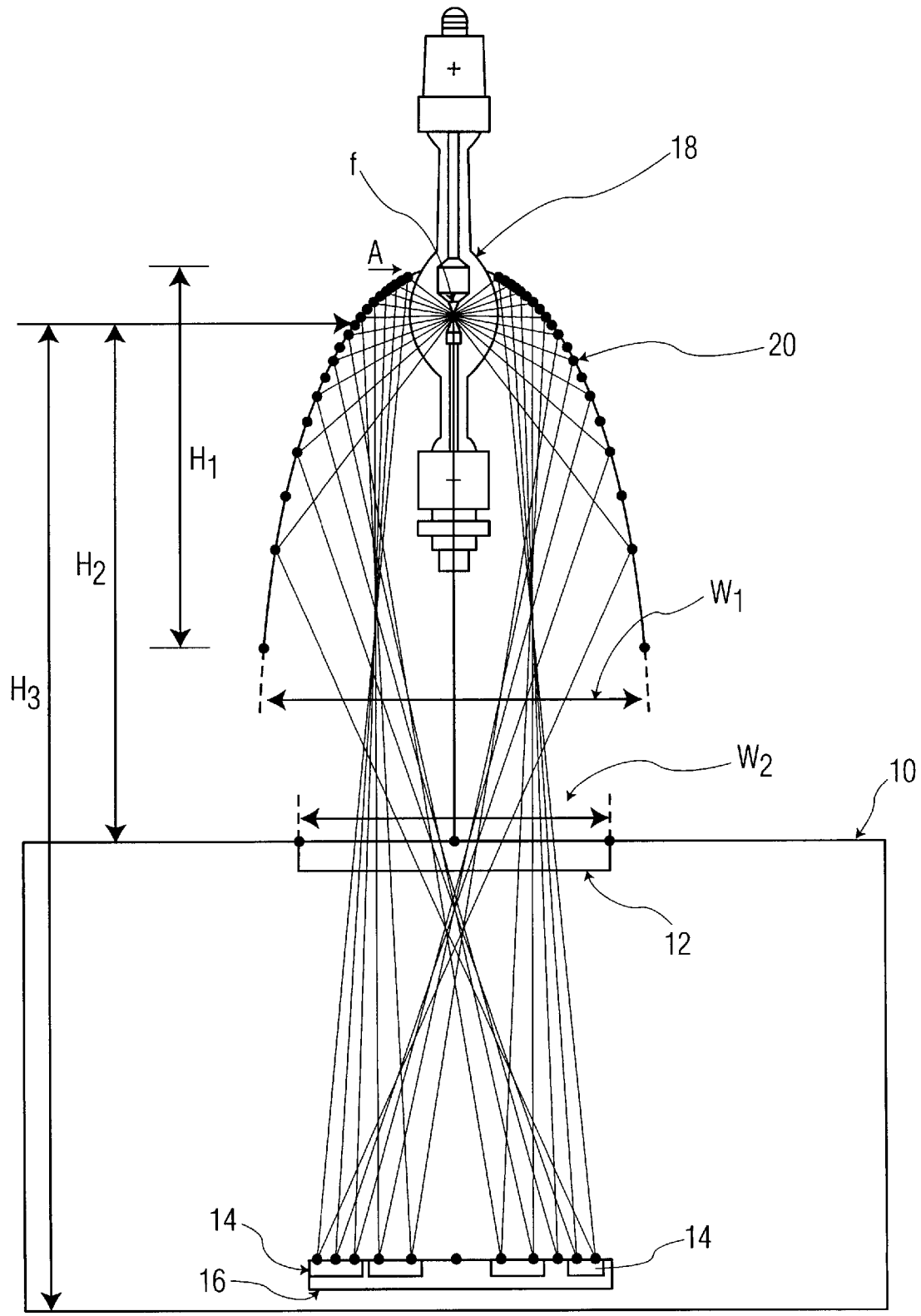
FIG. 1 shows an apparatus for cleaning semiconductor wafers according to the invention.

Referring to FIG. 1, there is shown an apparatus for performing the present invention method of cleaning semiconductor wafers. The apparatus comprises a vacuum chamber 10 having a transmissive window 12. The window 12 is shown in FIG. 1 as a four inch quartz window, but another material may be used to fabricate the window, provided it is sturdy and effectively transmits light. For example, a preferred material to be used for the window is sapphire, and other suitable materials include quartz, 7056 glass manufactured by corning, and calcium fluoride. Also, the dimensions of the window naturally will depend upon the size and number of photocathodes or semiconductor wafers to be cleaned.

Disposed within the vacuum chamber are a plurality of photocathodes 14 that are bonded onto a glass face plate 16. External to the system, there is provided a radiation source 18, which is preferably a Tungsten-halogen lamp, although a Xenon short arc lamp is depicted in FIG. 1 and can also be effectively used. Preferably, the power of the bulb is 750 Watts. A 64573 lamp manufactured by Osram advantageously may be used.

An ovoidal reflector 20 surrounds the heat source for directing the light through the transmissive window, into the vacuum chamber, and onto the photocathodes. The key concern with regard to the shape of the reflector is that it should be capable of directing light rays uniformly over the semi-conductor wafers so that each wafer is cleaned uniformly and all of a plurality of photocathodes are cleaned at the same rate. Preferably, the reflector is fabricated with aluminum, having a smooth reflective surface.

In optimizing the energy-gathering properties of the reflector, consideration further should be given to the dimensions of the reflector relative to the photocathodes and transmissive window. For example, referring to FIG. 1, such dimensions may include the width W1 of the reflector at the mouth (the widest open end), and the height H1 of the reflector (running from the apex A of the reflector to the mouth), and the curvature of the arc; the width of the transmission window W2; and the disposition of the focal point relative to the transmissive window and photocathodes, that is, H2 and H3, respectively, in FIG. 1. More particularly, the invention can be advantageously used to clean four photocathodes simultaneously when the reflector at its mouth spans about 4⅞ inches (W1=about 4⅞ inches) and is about 4¾ inches in height (H1=about 4¾ inches), and when W2 (the width of the transmissive window), is approximately 3¾ inches. In this case, the focal point, referenced by f in FIG. 1, is preferably disposed about 6½ inches above the window, that is, H2 is about 6 and ½ inches. The photocathodes 14 are disposed parallel to the transmissive window and about 12 inches beneath the focal point, that is, H3 is preferably about 12 inches. Preferably, the radiation source or lamp 18 is disposed at the focal point f of the reflector.

In operation, the photocathodes 14 are bonded onto the glass face plate 16, and they are disposed within the vacuum chamber 10 having a transmissive window 12 of the dimensions and materials described above. Before the photocathodes are coated, as desired, the radiation source 18 is placed above the transmissive window and surrounded with the parabolic reflector 20, according to the dimensions previously described. When four photocathodes are disposed within the vacuum chamber, the radiation source is preferably illuminated for approximately 30 minutes at a power of 750 watts. The same period of illumination may be used regardless of the number of photocathodes being cleaned.

It will further be understood that the embodiments described herein are merely exemplary and that a person skilled in the art may make variations and modifications without departing from the spirit and scope of the invention. All such variations and modifications are intended to be included within the scope of the appended claims.

I claim:

1. A method of cleaning semiconductor wafers or photocathodes, comprising the steps of:

provideing a vacuum chamber having a transmissive window that allows the passage of light energy into the chamber;

placing a plurality of semiconductor wafers or photocathodes into the chamber centrally below an internal surface of the transmissive window so that the wafers or photocathodes lie in a plane which is parallel to the transmissive window;

placing a source of light energy external to the chamber centrally above an external surface of the transmissive window, the source of light energy including a single light source surrounded by a single reflector having a geometric shape selected from the group consisting of ovoidal, conical, parabolic, ellipsoid, and hyperbolic shapes, the light source being capable of directing light energy through the transmissive window and over the semiconductor wafers or photocathodes when the light source is energized; and energizing the source of light energy for a predetermined time period wherein the light energy directed over the semiconductor wafers or photocathodes during the predetermined time period uniformly cleans all of the wafers or photocathodes at the same rate.

2. The method of claim 1, wherein the semiconductor wafers or photocathodes are bonded to a glass plate.

3. The method of claim 1, wherein the reflector is disposed concentrically around the single light source.

4. The method of claim 1, wherein the transmissive window is comprised of a material selected from the group consisting of sapphire, quartz, calcium fluoride and alkali barium borosilicate.

5. The method of claim 1, wherein the single light source comprises a lamp selected from the group consisting of Tungsten-halogen and Xenon lamps.

6. The method of claim 1, wherein the reflector has a width at its mouth of from 3½ to 4½ inches and a height from its apex to its mouth from 4¼ to 5¼ inches.

7. The method of claim 1, wherein the single light source is disposed substantially at the focal point of the reflector.

* * * * *